United States Patent [19]

Fujiyama et al.

[11] Patent Number: 5,781,402
[45] Date of Patent: Jul. 14, 1998

[54] CONDUCTING THICK FILM COMPOSITION, THICK FILM ELECTRODE, CERAMIC ELECTRONIC COMPONENT AND LAMINATED CERAMIC CAPACITOR

[75] Inventors: Masaki Fujiyama, Moriyama; Yukio Sanada, Fukui; Shuji Mushimoto, deceased, late of Nagaokakyo, all of Japan, by Yumi Mushimoto, Ryuichi Mushimoto, Hideshi Mushimoto, legal representatives

[73] Assignee: Murata Manufacturing Co., Ltd., Japan

[21] Appl. No.: 578,105

[22] Filed: Dec. 26, 1995

[30] Foreign Application Priority Data

Dec. 26, 1994 [JP] Japan ................................ 6-322815

[51] Int. Cl.$^6$ ............... H01G 4/06; H01G 4/008; B22F 7/04; B22F 1/00
[52] U.S. Cl. ............... 361/321.4; 361/305; 428/557; 428/546; 75/252
[58] Field of Search ............... 428/209, 551, 428/546, 547, 557, 560; 252/512; 75/252; 361/305, 321.3, 321.4

[56] References Cited

U.S. PATENT DOCUMENTS

| | | | |
|---|---|---|---|
| 4,072,771 | 2/1978 | Grier | 427/96 |
| 4,810,420 | 3/1989 | Prabhu et al. | 252/512 |
| 4,865,772 | 9/1989 | Suehiro et al. | 252/512 |
| 4,894,184 | 1/1990 | Fukuoka et al. | 252/512 |
| 4,937,016 | 6/1990 | Suehiro et al. | 252/512 |
| 5,198,154 | 3/1993 | Yokoyama et al. | 252/514 |
| 5,336,301 | 8/1994 | Tani et al. | 106/1.18 |
| 5,376,596 | 12/1994 | Tokuda et al. | 501/19 |
| 5,418,193 | 5/1995 | Tani et al. | 501/19 |
| 5,536,293 | 7/1996 | Yamamoto et al. | 75/255 |

*Primary Examiner*—John J. Zimmerman
*Assistant Examiner*—Michael LaVilla
*Attorney, Agent, or Firm*—Ostrolenk, Faber, Gerb & Soffen, LLP

[57] ABSTRACT

A conducting thick film composition, a thick film electrode made by sintering this composition, and a ceramic electronic component and a laminated ceramic capacitor in which this thick film electrode is used of which the electrical reliability are improved by the strength of the bond between the ceramic substrate and a thick film electrode being increased by the elimination of blistering and cracking of the electrode during sintering of the composition and the adherence of solder to the electrode being improved by the elimination of glass separation out onto the surface of the electrode during sintering. The conducting thick film composition comprises Cu powder, glass powder and an organic vehicle, the Cu powder comprises spherical powder and scaly powder and the glass powder comprises borosilicate zinc glass and borosilicate barium glass.

21 Claims, 1 Drawing Sheet

CONDUCTING THICK FILM COMPOSITION, THICK FILM ELECTRODE, CERAMIC ELECTRONIC COMPONENT AND LAMINATED CERAMIC CAPACITOR

BACKGROUND OF THE INVENTION

This invention relates to a conducting thick film composition and ceramic electronic components such as a laminated ceramic capacitor wherein this conducting thick film composition is used for a thick film electrode.

Conventionally, a thick film electrode of a ceramic electronic component, for example an external electrode of a laminated ceramic capacitor, is made by coating a conducting thick film composition comprising Ag powder or Ag-Pd powder (which are conducting powders), glass powder (which is a filler) and an organic vehicle consisting of a base resin and an organic solvent onto an end surface of a stack of alternately laminated ceramic dielectric layers and internal electrodes and then baking. After the external electrode is formed, plating is carried out to increase the solderability of the electrode. For example, a Ni/Sn solderable layer is formed by electroplating.

A large quantity of glass powder filler is included in the thick film composition in order to maintain the strength of the bond between the stack and the external electrode. The glass powder melts during the baking of the electrode and melted glass moves to the interface between the stack and the external electrode and acts as an adhesive.

Ag powder or Ag-Pd powder has mainly been used as the conducting powder. Recently inexpensive Cu powder has begun to be used instead of Ag powder or Ag-Pd powder to reduce costs. However, when Cu powder has been used as the conducting powder to promote cost reduction, the following problems have been encountered:

(1) Because Cu is easily oxidized, baking must be carried out in a non-oxidizing atmosphere. In this case, the rate of decomposition of the resin component in the organic vehicle is slow so that the resin component remains until the temperature at which the glass starts to melt is reached. Consequently, gas produced by the decomposition of the resin component forms bubbles in the melted glass. As a result, a phenomenon called blisters occurs wherein parts of the external electrode swell up. Such blisters are also caused by gas produced by the ceramic and the glass components reacting with each other at high temperatures. That is, these blisters tend to form at the high temperatures at which sintering of the surface of the Cu electrode has progressed and there is no way for produced gas to escape. The strength of the bond between the stack and the external electrode is sometimes reduced by these blisters.

(2) Because the glass powder is reduced during baking in a non-oxidizing atmosphere and its properties deteriorate, the glass powder in the electrode tends to dissolve in the plating liquid when the plating is thereafter carried out. Consequently, the plating liquid dissolved glass in the external electrode during the plating process can reach as far as the internal electrodes. As a result of this, the strength of the bonds between the internal electrodes and the ceramic dielectric layers of the laminated ceramic capacitor falls, peeling occurs at these interfaces and cracks occur in the ceramic dielectric itself.

(3) Because there is a large quantity of glass powder present when the baking is carried out at a high temperature and in a non-oxidizing atmosphere, glass covers much of the surface of the external electrode so that a plating layer cannot be formed, and the solder wettability of the surface falls.

SUMMARY OF THE INVENTION

An object of this invention is to provide a conducting thick film composition, a thick film electrode, a ceramic electronic component and a laminated ceramic capacitor with which it is possible to improve electrical reliability by improving the strength of the bond between a ceramic substrate and a thick film electrode and improve the adherence of solder to a thick film electrode.

DESCRIPTION OF THE INVENTION

To achieve the above object and other objects, the invention provides a first embodiment conducting thick film composition containing Cu powder, glass powder and an organic vehicle in which the Cu powder comprises both spherical powder and scaly (i.e. not substantially spherical) powder. By means of this constitution, the invention makes it possible to prevent the occurrence of blistering of the thick film electrode while the electrode is being formed, to increase the strength of the bond between the ceramic element and thick film electrode and to improve the adherence of solder to the thick film electrode.

Sintering of the spherical powder starts and the sintered density becomes high in the range of about 700° to 800° C., which is the temperature region in which blistering occurs. With only spherical powder, the void rate of the thick film electrode during sintering is insufficient and consequently blisters form on the surface of the thick film electrode and the strength of the bond between the ceramic element and the thick film electrode is low.

On the other hand, the scaly powder peels off relatively easily and the bonding strength of the thick film electrode is low because the strength with which scaly powder bonds to glass is small. Accordingly, scaly powder is blended with spherical powder in this invention. Because sintering of this scaly powder does not start fully in the temperature region at which blistering occurs, the void rate of the thick film electrode during sintering is effectively increased, and passages through which produced gas can escape are formed. This prevents the occurrence of blistering of the thick film electrode surface. As a result, it is possible to raise the strength of the bond between the ceramic element and the thick film electrode.

Also, it is possible by this method to reduce the amount of glass powder, which had been included in large quantities in order to maintain the strength of the bond between the ceramic element and the thick film electrode. Therefore, deterioration of the plating adherence caused by glass melting and covering the surface of the thick film electrode can be prevented and soldering can be improved.

Also, the invention provides a second embodiment conducting thick film composition including Cu powder, glass powder and an organic vehicle wherein the glass powder comprises both borosilicate zinc glass and borosilicate barium glass. By means of this constitution, the invention makes it possible to prevent cracking of the ceramic element occurring during electrode formation, to raise the strength of the bond between the ceramic element and thick film electrode and improve the adherence of solder to the thick film electrode.

The plating liquid does not readily dissolve borosilicate zinc glass or borosilicate barium glass when these are compared to other glasses in dissolving tests and the like. Reduction in the strength of the bond between the ceramic element and the thick film electrode caused by plating liquid permeating into the inside of the thick film electrode can thus be suppressed and cracking of the ceramic element can be prevented.

The softening point of borosilicate zinc glass is about 570° C. to 700° C. and borosilicate zinc glass readily sinters at over about 600° C., which is the temperature at the time of electrode formation. At this temperature, the glass becomes too fluid and comes onto the surface of the thick film electrode during baking of the conducting thick film composition. As a result, the plating liquid does not adhere well. On the other hand, borosilicate barium glass does not readily melt during baking of the conducting thick film composition, and it hinders sintering of the conducting powder.

For this reason, borosilicate zinc glass and borosilicate barium glass are blended together in this invention. Because the softening point of borosilicate barium glass is over about 770° C., a value higher than that of borosilicate zinc glass, and it does not sinter readily at the temperature of the time of electrode formation, its fluidity at that temperature is low. By taking advantage of this, it is possible to adjust the fluidity of the glass with borosilicate barium glass and prevent glass from coming onto the surface of the thick film electrode. Accordingly, blending borosilicate zinc glass and borosilicate barium glass makes it possible to achieve a conducting thick film composition to which a plating liquid readily adheres, with which the strength of the bond between the ceramic element and thick film electrode is high and with which the plating liquid does not readily dissolve.

It is also possible to reduce the amount of glass powder which had been included in large quantities in order to maintain the strength of the bond between the ceramic element and the thick film electrode. Because of this, deterioration of the plating film adherence caused by glass melting and covering the surface of the thick film electrode can be prevented and soldering can be improved.

Also, the invention provides a third embodiment conducting thick film composition including Cu powder, glass powder and an organic vehicle wherein the Cu powder comprises spherical powder and scaly powder and also the glass powder comprises borosilicate zinc glass and borosilicate barium glass. By means of this constitution, the invention makes it possible to prevent blistering of a thick film electrode and cracking of the ceramic element occurring during electrode formation, to raise the strength of the bond between the ceramic element and the thick film electrode and further, to improve the adhesion of solder to the thick film electrode.

As a result of the Cu powder comprising spherical powder and scaly powder, the occurrence of blistering of the surface of the thick film electrode is prevented, and it is possible to raise the strength of the bond between the ceramic element and the thick film electrode. Also, as a result of the glass powder comprising borosilicate zinc glass and borosilicate barium glass, the plating liquid adheres well to the conducting thick film composition and does not readily dissolve it and consequently, it is possible to make a conducting thick film composition where the strength of the bond between the ceramic element and the thick film electrode is high.

Furthermore, it is possible in this method to reduce the amount of glass powder, which had been included in large quantities in order to maintain the strength of the bond between the ceramic element and the thick film electrode. Deterioration of the plating adherence caused by glass melting and covering the surface of the thick film electrode can be prevented and soldering can be improved.

In the invention, preferably, the Cu powder and the glass powder total about 65 to 85 wt % of 100 wt % of the conducting thick film composition and the organic vehicle is about 15 to 35 wt % of 100 wt % of the conducting thick film composition. More preferably, the Cu and glass constitute about 65 to 78 wt %.

When the total amount of the Cu powder and the glass powder is over 65 wt % of the conducting thick film composition, the viscosity of the conducting thick film composition is high, the levelability of the conducting thick film composition after it is coated is good and sagging and the like does not occur. Also, when the total amount of the Cu powder and the glass powder is under 85 wt % of the conducting thick film composition, it is easy to coat the conducting thick film composition because it is pastelike. The amount of the organic vehicle is the remainder of the conducting thick film composition excluding the Cu powder and the glass powder.

In the invention, preferably, the glass powder is about 3 to 15 wt %, more preferably about 5 to 10 wt % of 100 wt % of the conducting thick film composition. When the glass powder constitutes over 3 wt % of the conducting thick film composition, a high bonding strength between the ceramic element and a thick film electrode formed after baking of the conducting thick film composition can be obtained. Also, when the glass powder constitutes less than 15 wt % of the conducting thick film composition, glass does not separate out onto the surface of the thick film electrode and the Ni/Sn plating adherence improves.

In the invention, the average particle diameter of the spherical powder is preferably about 0.3 to 5.0 µm. When the average particle diameter is over 0.3 µm, the particles are large and are not readily oxidized. When the average particle diameter is 5.0 µm or less, the sintered density is high, the composition becomes fine and the moisture resistance improves.

In the invention, more preferably, the average particle diameter of the Cu spherical powder is about 0.3 to 1.5 µm. The reason for this is that an average particle diameter of the spherical powder in the range 0.3 to 1.5 µm is optimum.

In the invention, preferably, the Cu spherical powder comprises a fine spherical powder having an average particle diameter of about 0.3 to 1.5 µm and a coarse spherical powder of which the average particle diameter is in the range of about 2.0 to 5.0 µm. By mixing a scaly powder with a fine spherical powder of which the average particle diameter is 0.3 to 1.5 µm and then further mixing with this a coarse spherical powder of which the average particle diameter is 2.0 to 5.0 µm, the coating formed further improves.

Also, in the invention, preferably, the average length of the Cu scaly powder is about 10 to 40 µm. When the average length is over 10 µm, an ample effect of retarding the sintering can be obtained. When the average length is under 40 µm, the Cu powder is easy to coat onto the ceramic element itself, which is small, and its surface can be made smooth.

Preferably, the scaly powder constitutes about 10 wt % to 70 wt % of the total 100 wt % of the fine spherical powder, the coarse spherical powder and the scaly powder. The reason for this is that when the amount of the scaly powder is over 10 wt %, it does not become very fine during sintering of the conducting thick film composition and the amount of glass flowing onto the surface of the thick film electrode is small and as a result, the plating adheres easily to the surface of the thick film electrode. When the amount of the scaly powder is below 70 wt %, the coatability of the thick film electrode is good and the sintered density is high and consequently, the conducting thick film composition resists the penetration of plating liquid.

In the invention, preferably, the glass powder comprises borosilicate zinc glass and borosilicate barium glass in which the borosilicate zinc glass is more than about 50 wt % of 100 wt % of the glass powder. Preferably, it constitutes about 50 to 80 wt % of the glass.

When the borosilicate zinc glass constitutes over 50 wt % of the glass powder, sintering is rapid because the blended amount of borosilicate zinc glass is large and the blended amount of borosilicate barium glass is small, so that at the same temperature the composition becomes finer and the sintered density is higher and consequently the composition has a better a heat shock property. When the borosilicate zinc glass is 100 wt %, excessive fluidity causes a glass layer to form on the surface and cover the Cu powder and consequently the plating process becomes difficult. Therefore, a borosilicate zinc glass content of 100 wt % is not preferred because the plating adherence is impaired.

In the invention, preferably, the borosilicate zinc glass contains about 3 to 35 wt % of ZnO in 100 wt % of the borosilicate zinc glass. When the amount of the ZnO is greater than 3 wt %, the composition has better Ni/Sn plating adherence characteristics. When the amount of ZnO is less than 35 wt %, the composition has better insulating and heat shock characteristics.

In the invention, preferably, the borosilicate barium glass contains 10 to 40 wt % of BaO in the 100 wt % of the borosilicate barium glass.

When the amount of the BaO is greater than 10 wt %, the composition has better insulating, Ni/Sn plating adherence and heat shock characteristics. When this amount is less than 40 wt %, the composition has better insulating and heat shock characteristics.

Also, in the invention, preferably, the borosilicate zinc glass and the borosilicate barium glass contain at least one member of the group of alumina, alkali metal oxide and alkaline earth metal oxide. The reason for this is that when alumina is added, the acid resistance of the composition is improved and when an alkali metal oxide or an alkaline earth metal oxide is added, the softening point of the borosilicate zinc glass and the borosilicate barium glass is lowered and the glass powder melts more readily.

The invention also provides a thick film electrode formed on a ceramic element of a ceramic electronic component, the thick film electrode comprising a sintered film made by sintering a conducting thick film composition according to the invention.

That is, a film to constitute a thick film electrode can be formed by sintering the abovementioned conducting thick film composition by heating the conducting thick film composition at a suitable temperature, for example in the range of about 600° C. to 800° C.

The invention also provides a ceramic electronic component comprising a ceramic element and a terminal electrode formed on the ceramic element in which the terminal electrode comprises a thick film electrode according to the invention.

That is, it is possible to prevent blistering of the thick film electrode and cracking of the ceramic element occurring during formation of a terminal electrode of a ceramic electronic component, to improve the strength of the bond between the ceramic element and the terminal electrode and to improve the adhesion of solder to the terminal electrode.

Also, the invention provides a laminated ceramic capacitor comprising a stack made up of a ceramic dielectric layer and internal electrodes disposed facing each other with the ceramic dielectric layer therebetween and external electrodes each having one end connected to one of the internal electrodes, the external electrodes being thick film electrodes according to the invention. That is, it is possible to prevent blistering of the thick film electrode and cracking of the stack occurring during formation of an external electrode of the laminated ceramic capacitor, to improve the strength of the bond between the stack and the external electrode and to improve the adherence of solder to the external electrode.

DETAILED DESCRIPTION OF THE INVENTION

A preferred embodiment of a thick film electrode consisting of a sintered film made by sintering a conducting thick film composition according to the invention will now be described with reference to cases wherein such thick film electrodes are used in a platelike ceramic capacitor and a laminated ceramic capacitor, which are ceramic electronic components.

Figure 1:
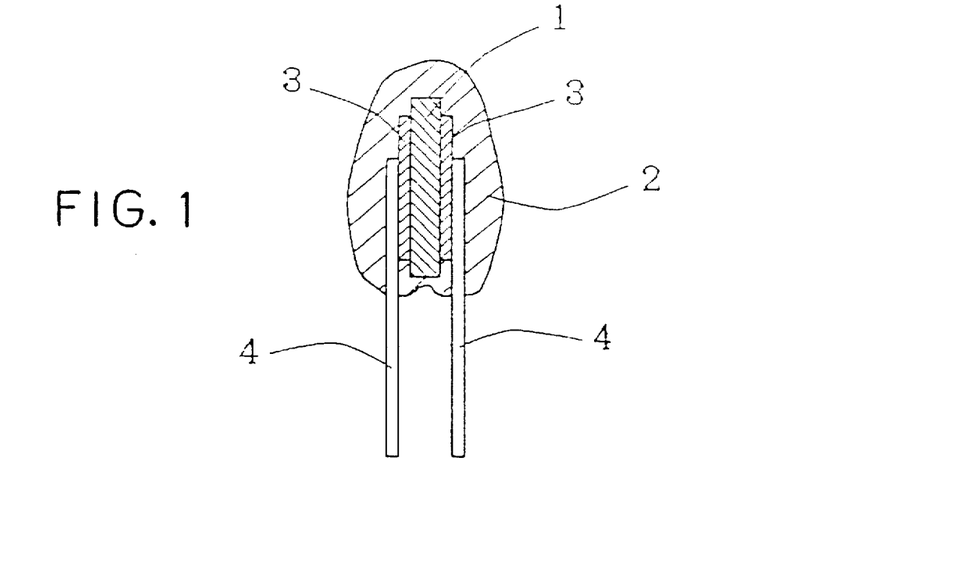
FIG. 1 is a sectional view of a preferred embodiment of the invention.

FIG. 1 is a sectional view of a platelike ceramic capacitor. This platelike ceramic capacitor has a platelike ceramic dielectric 1 which is a ceramic element, a pair of terminal electrodes 3 disposed facing each other on the main flat surfaces of the ceramic dielectric 1, lead terminals 4 soldered to the terminal electrodes 3, and a covering resin 2.

The ceramic dielectric 1 is made for example of a porcelain material such as barium titanate or lead niobate, the terminal electrodes 3 are formed on opposite main flat surfaces of the ceramic dielectric 1 and the covering resin 2 covers the ceramic dielectric 1 and the terminal electrodes 3.

The lead terminals 4 are provided for connecting the terminal electrodes 3 to a circuit board not shown in the drawing and each have one end embedded in the covering resin 2 and connected to one of the terminal electrodes 3 with the other end projecting from the covering resin 2 and connected to the circuit board.

Figure 2:
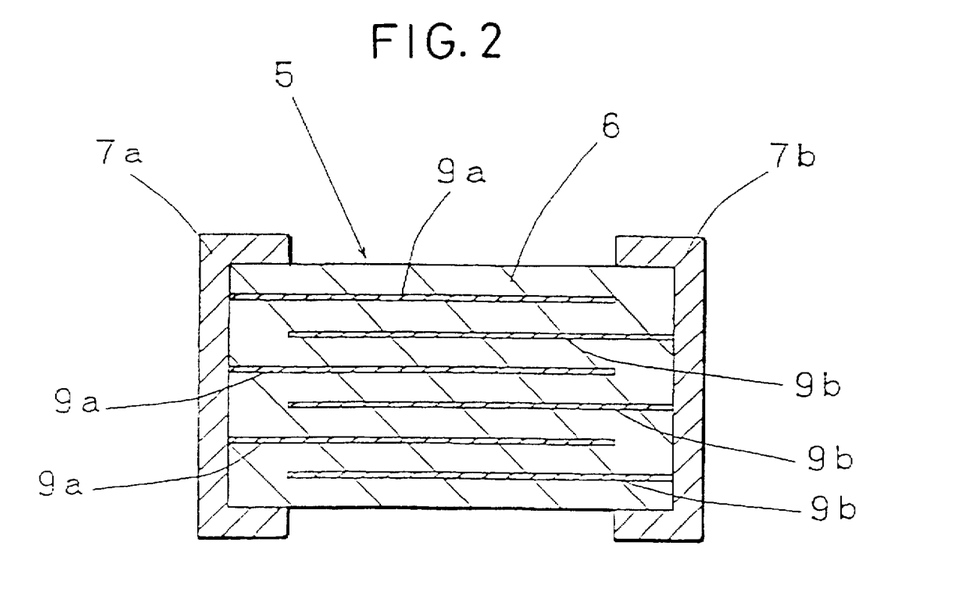
FIG. 2 is a sectional view of another preferred embodiment of the invention.

FIG. 2 is a sectional view of a laminated ceramic capacitor. This laminated ceramic capacitor has a rectangular parallelopiped shaped stack 5 and a pair of external electrodes 7a, 7b disposed facing each other on the ends of stack 5.

Here, the stack 5 is made by sintering and thereby integrating a laminated plurality of ceramic sheets 6 which are ceramic dielectric layers consisting of for example a porcelain material such as barium titanate or lead niobate. Pluralities of internal electrodes 9a, 9b are disposed alternately inside stack 5. The internal electrodes 9a are connected to the external electrode 7a disposed on one side of the stack 5 and are insulated from the external electrode 7b disposed on the other side of the stack 5. The internal electrodes 9b are connected to the external electrode 7b and are insulated from the external electrode 7a. The internal electrodes 9a, 9b are disposed in parallel with each other.

The terminal electrodes 3 of the platelike ceramic capacitor and the external electrodes 7a, 7b of the laminated ceramic capacitor described above are thick film electrodes consisting of sintered films formed by baking a conducting thick film composition according to the invention.

Next, conducting thick film compositions according to the invention will be described in detail. All conducting thick film compositions according to this invention contain a Cu powder, a glass powder and an organic vehicle.

(First Preferred Embodiment)

In this preferred embodiment, the Cu powder and the glass powder are blended together in the amount of 65 to 85 wt % of the 100 wt % of the conducting thick film composition and the glass powder is blended in the amount of 3 to 15 wt % of the 100 wt % of the conducting thick film composition.

As the Cu powder, a mixture of a spherical powder and a scaly powder having different particle shapes is used. The spherical powder consists of substantially spherical Cu particles and is made up of a fine spherical powder A of average particle diameter 0.3 to 1.5 μm and a coarse spherical powder B of average particle diameter 2.0 to 5.0 μm. The scaly powder is a scaly powder C consisting of flake-shaped particles of about several μm in thickness and an average length 10 to 40 μm.

As the glass powder, borosilicate zinc glasses and borosilicate barium glasses set forth in a second preferred embodiment described below are used. That is, the borosilicate zinc glass is glass powder containing $ZnO$-$SiO_2$-$B_2O_3$ and bonded with other components such as alumina, alkali metal oxides such as $Li_2O$ and alkaline earth metal oxides such as CaO. The borosilicate barium glass is glass powder containing $BaO$-$SiO_2$-$B_2O_3$ and bonded with other components such as alumina, alkali metal oxides such as $Li_2O$ and alkaline earth metal oxides such as CaO and BaO. The borosilicate zinc glass is of 50 wt % or more of the glass powder. Here the borosilicate zinc glass contains ZnO in the amount of 3 to 35 wt % of the 100 wt % of the borosilicate zinc glass and the borosilicate barium glass contains BaO in the amount of 10 to 40 wt % of the 100 wt % of the borosilicate barium glass.

As the organic vehicle, an acrylic resin base resin dissolved in butyl cellosolve, which is an organic solvent, is used.

Table 1 shows for conducting thick film compositions of preferred embodiments 1-1 to 1-16, the Cu powder blend ratio (the respective blend proportions of the fine spherical powder A, the coarse spherical powder B and the scaly powder C based on 100 wt % of the total of these three), an Ni/Sn plating film adherence evaluation, the electrode bond strength, the presence or absence of blisters and an overall evaluation.

TABLE 1

|  | Cu powder blend ratio | | | Ni/Sn plating film adherence | electrode bond strength (N) | blisters | overall evaluation |
|---|---|---|---|---|---|---|---|
|  | A | B | C |  |  |  |  |
| embodiment |  |  |  |  |  |  |  |
| 1-1 | 90 | 0 | 10 | ○ | 45 | ○ | ○ |
| 1-2 | 80 | 0 | 20 | ○ | 42 | ○ | ○ |
| 1-3 | 80 | 10 | 10 | ○ | 43 | ○ | ○ |
| 1-4 | 70 | 20 | 10 | ○ | 45 | ○ | ○ |
| 1-5 | 70 | 10 | 20 | ○ | 41 | ○ | ○ |
| 1-6 | 60 | 30 | 10 | ○ | 43 | ○ | ○ |
| 1-7 | 60 | 20 | 20 | ○ | 45 | ○ | ○ |
| 1-8 | 60 | 10 | 30 | ○ | 40 | ○ | ○ |
| 1-9 | 50 | 30 | 20 | ○ | 45 | ○ | ○ |
| 1-10 | 50 | 40 | 10 | ○ | 42 | ○ | ○ |
| 1-11 | 50 | 10 | 40 | ○ | 38 | ○ | ○ |
| 1-12 | 40 | 40 | 20 | ○ | 40 | ○ | ○ |
| 1-13 | 40 | 20 | 40 | ○ | 36 | ○ | ○ |
| 1-14 | 30 | 50 | 20 | ○ | 43 | ○ | ○ |
| 1-15 | 20 | 70 | 10 | ○ | 41 | ○ | ○ |
| 1-16 | 10 | 20 | 70 | ○ | 34 | ○ | ○ |
| reference example |  |  |  |  |  |  |  |
| 1-1 | 100 | 0 | 0 | X | 40 | X | X |
| 1-2 | 0 | 100 | 0 | X | 40 | X | X |
| 1-3 | 0 | 0 | 100 | ○ | 26 | ○ | X |

For reference, Table 1 also shows an Ni/Sn plating film adherence evaluation, the electrode bond strength, the presence or absence of blisters and an overall evaluation for three other compositions, reference example 1-1 to reference example 1-3, each containing one of the fine spherical powder A, the coarse spherical powder B and the scaly powder C as 100 wt % of the Cu powder.

Next, measurement methods and measurement results of the evaluations of the Ni/Sn plating film adherence, the electrode bond strength and the presence or absence of blisters will be described as will the overall evaluations based on these results.

To evaluate the Ni/Sn plating film adherence, external electrodes were first formed on both ends of a laminated ceramic capacitor chip by baking at about 800° C. in a nitrogen atmosphere and Ni/Sn plating was carried out. Then, the film thickness of the Ni/Sn plating film was measured with a fluorescence X-ray film thickness meter and when the film thickness was greater than 1 µm the film was deemed good as indicated with a 0 in Table 1 and when it was less than 1 µm, the film was deemed defective as indicated with a x in Table 1.

In both reference example 1-1 and reference example 1-2, the film thickness of the Ni/Sn plating film was less than 1 µm; it could also be seen from the external appearance that the Cu electrode was exposed, and the plating adherence was therefore defective.

In the case of reference example 1-1, the reason for this is probably because only the spherical powder A was used as the Cu powder, and the void rate of the thick film electrode during sintering was insufficient and consequently deterioration in the Ni/Sn plating film adherence caused by glass melting and covering the surface of the thick film electrode occurred.

In the case of reference example 1-2, the reason is probably that only the spherical powder B was used as the Cu powder and deterioration in the Ni/Sn plating film adherence occurred in the same way as in reference example 1-1.

Accordingly, from the evaluation of the Ni/Sn plating film adherence, it can be seen that not only the spherical powder A or the spherical powder B but also the scaly powder C which increases the void rate of the thick film electrode is necessary in the Cu powder.

With respect to the electrode bond strength, a wire was first soldered to the end surface of the thick film electrode, both ends of the thick film electrode were pulled and the size of the force (units: N) at the time when the thick film electrode and the wire parted is shown in Table 1; the electrode bond strength was deemed to be good when the force was greater than 30N and deemed to be defective when the force was less than 30N.

In reference example 1-3, the electrode bond strength was 26N, i.e., less than 30N, and therefore deemed to be defective, and the thick film electrode had peeled off at its interface with the chip. The reason for this is probably that in reference example 1-3 only the scaly powder C was used as the Cu powder and the bonding force with glass was small and the thick film electrode consequently peeled off relatively easily and the electrode bond strength had therefore decreased.

The presence or absence of blisters was determined from the external appearance of a thick film electrode of a laminated ceramic capacitor formed by the manufacturing method described above. When air bubbles formed at the surface of the thick film electrode and irregularities had formed in the thick film electrode, it was deemed that blistering had occurred. This was shown by a x in Table 1, and when not present, this was shown with a 0 in Table 1.

Blistering occurred in both reference example 1-1 and reference example 1-2.

In the case of reference example 1-1, the reason for this is probably that only the spherical powder A was used as the Cu powder and the void rate of the thick film electrode during sintering was insufficient and consequently, there was no way for produced gas to escape and blistering occurred as a result.

In the case of reference example 1-2, the reason is probably that only the spherical powder B was used as the Cu powder and the void rate of the thick film electrode during sintering was insufficient and consequently, there was no way for produced gas to escape and blistering occurred as a result, as it did in the case of reference example 1-1.

Accordingly, because preferred embodiment 1-1 to preferred embodiment 1-16 were deemed good in Ni/Sn plating film adherence, electrode bond strength and the presence or absence of blistering, this is indicated by a 0 in Table 1. Because reference example 1-1 to reference example 1-3 were deemed to be defective in Ni/Sn plating film adherence, in electrode bond strength or in the presence or absence of blistering, this is indicated by a x in Table 1.

The conducting thick film composition of the present invention is not limited to the preferred embodiment described above and various changes can be made within the scope of the invention.

For example, although borosilicate zinc glass and borosilicate barium glass set forth in the second preferred embodiment described below were used as the glass powder in the preferred embodiment described above, only borosilicate zinc glass may be used or only borosilicate barium glass may be used. Alternatively, some other glass may be used. In any case, the objects of the invention can be achieved.

Also, for example, although an acrylic resin base resin dissolved in butyl cellosolve as an organic solvent was used as the organic vehicle in the preferred embodiment described above, a cellulose resin or a butyral resin or the like may be used as the base resin and terpineol may be used as the organic solvent.

(Second Preferred Embodiment)

In this preferred embodiment, the Cu powder and the glass powder together are in the amount of 65 to 85 wt % of the 100 wt % of the conducting thick film composition and the glass powder is 3 to 15 wt % of the 100 wt % of the conducting thick film composition.

As the glass powder, borosilicate zinc glass and borosilicate barium glass are used. The borosilicate zinc glass is a glass powder containing $ZnO\text{-}SiO_2\text{-}B_2O_3$ and bonded with other components such as alumina, alkali metal oxides such as $Li_2O$ and alkaline earth metal oxides such as CaO. The borosilicate barium glass is a glass powder containing $BaO\text{-}SiO_2\text{-}B_2O_3$ and bonded with other components such as alumina, alkali metal oxides such as $Li_2O$ and alkaline earth metal oxides such as CaO and BaO.

As the Cu powder, the same Cu powder as that set forth in the first preferred embodiment was used. That is, a mixture of a spherical Cu powder and a scaly Cu powder having different particle shapes is used. The spherical powder consists of substantially spherical Cu particles and is made up of a fine spherical powder A of average particle diameter 0.3 to 1.5 µm and a coarse spherical powder B of average particle diameter 2.0 to 5.0 µm. The scaly powder is a scaly powder C consisting of flake-shaped particles of several µm in thickness and average length 10 to 40 µm.

As the organic solvent, an acrylic resin dissolved in butyl cellosolve was used.

Table 2 shows for conducting thick film compositions of preferred embodiments 2-1 to 2-10, frit numbers to show the respective borosilicate zinc glasses ("Zn type") and borosilicate barium glasses ("Ba type") used, the wt % of the glass powder with respect to the 100 wt % of the conducting thick film composition, the wt % of the borosilicate zinc glass with respect to the 100 wt % of the glass powder, the insulation resistance NG count, the Ni/Sn plating film adherence, the heat shock property and an overall evaluation based on these.

TABLE 2

| | frit number | | amount of glass powder added | wt % of Zn | insulation resistance NG count | Ni/Sn plating | heat shock property | overall |
|---|---|---|---|---|---|---|---|---|
| | Zn type | Ba type | (wt %) | type glass | (n = 20) | film adherence | $\Delta T = 375°$ C. | evaluation |
| embodiment | | | | | | | | |
| 2-1 | B | H | 4.0 | 70 | 0 | ○ | ○ | ○ |
| 2-2 | B | H | 9.0 | 50 | 0 | ○ | ○ | ○ |
| 2-3 | B | H | 9.0 | 70 | 0 | ○ | ○ | ○ |
| 2-4 | B | H | 9.0 | 90 | 0 | ○ | ○ | ○ |
| 2-5 | B | H | 9.0 | 100 | 0 | ○ | ○ | ○ |
| 2-6 | B | H | 13.0 | 70 | 0 | ○ | ○ | ○ |
| 2-7 | B | G | 9.0 | 70 | 0 | ○ | ○ | ○ |
| 2-8 | B | I | 9.0 | 70 | 0 | ○ | ○ | ○ |
| 2-9 | A | H | 9.0 | 70 | 0 | ○ | ○ | ○ |
| 2-10 | C | H | 9.0 | 70 | 0 | ○ | ○ | ○ |
| reference example | | | | | | | | |
| 2-1 | B | H | 1.0 | 70 | 15 | ○ | X | X |
| 2-2 | B | H | 9.0 | 20 | 0 | ○ | X | X |
| 2-3 | B | H | 20.0 | 70 | 0 | X | ○ | X |
| 2-4 | B | F | 9.0 | 70 | 10 | X | X | X |
| 2-5 | B | J | 9.0 | 70 | 3 | ○ | X | X |
| 2-6 | D | H | 9.0 | 70 | 10 | ○ | X | X |
| 2-7 | E | H | 9.0 | 70 | 0 | X | ○ | X |
| 2-8 | B | H | 2.0 | 60 | 15 | ○ | X | X |
| 2-9 | B | H | 17.0 | 50 | 0 | X | ○ | X |

For comparison, reference examples 2-1 to 2-9 are also shown in Table 2.

Table 3 shows the composition (units are wt %) of frit numbers A, B, C which are preferred examples of borosilicate zinc glasses, the composition (units are wt %) of frit numbers G, H, I which are preferred examples of borosilicate barium glasses, the composition (units are wt %) of frit numbers D, E which are reference examples of borosilicate zinc glasses, and the composition (units are wt %) of frit numbers F, J which are reference examples of borosilicate barium glasses.

TABLE 3

| | | ZnO | BaO | $SiO_2$ | $B_2O_3$ | $Al_2O_3$ | $Li_2O$ | CaO |
|---|---|---|---|---|---|---|---|---|
| embodiment | | | | | | | | |
| borosilicate zinc glass | A | 4 | — | 50 | 30 | 2 | 10 | 4 |
| | B | 20 | — | 20 | 50 | 2 | 5 | 3 |
| | C | 35 | — | 35 | 20 | 0 | 5 | 5 |
| borosilicate barium glass | G | — | 15 | 10 | 50 | 10 | 6 | 4 |
| | H | — | 30 | 45 | 15 | 0 | 6 | 4 |
| | I | — | 40 | 10 | 30 | 10 | 6 | 4 |
| reference example | | | | | | | | |
| borosilicate zinc glass | D | 50 | — | 10 | 30 | 0 | 5 | 5 |
| | E | 2 | — | 50 | 40 | 2 | 5 | 1 |
| borosilicate barium glass | F | — | 5 | 40 | 30 | 10 | 6 | 4 |
| | J | — | 55 | 10 | 15 | 10 | 6 | 4 |

Next, measurement methods and measurement results of the evaluations of the insulation resistance NG count, the Ni/Sn plating film adherence and the heat shock property will be described and then the overall evaluations based on these results will be discussed. To evaluate the insulation resistance NG count, external electrodes were first formed on both ends of a laminated ceramic capacitor chip by baking at about 800° C. in a nitrogen atmosphere and Ni/Sn plating was carried out. Then, the insulation resistance across the two electrodes was measured and deemed to be NG when the resistance value was below $1 \times 10^9 \Omega$. This measurement was carried out for 20 laminated ceramic capacitors and the number of NG capacitors shown in Table 2. When there were no NG laminated ceramic capacitors, the example was deemed to be good, but if there was even one NG laminated ceramic capacitor, the example was deemed to be inferior. In reference example 2-1, there were 15 NG laminated ceramic capacitors out of 20 and the example was therefore inferior. The reason for this is that the amount of glass powder was small, at 1.0 wt %, deterioration in insulation resistance occurred due to cracking in the laminated ceramic capacitor and shorting occurred.

In reference example 2-4, there were 10 NG laminated ceramic capacitors out of 20 and the example was therefore inferior. The reason for this is that in the composition ratio of the frit number F borosilicate barium glass, the proportion of BaO was low, at 5 wt %, with respect to the 100 wt % of the glass powder, deterioration in insulation resistance occurred due to cracking in the laminated ceramic capacitor and shorting occurred.

In reference example 2-5, there were 3 NG laminated ceramic capacitors out of 20 and the example was therefore inferior. The reason for this is that in the composition ratio of the frit number J borosilicate barium glass, the proportion of BaO was high, at 55 wt %, with respect to the 100 wt % of the glass powder, deterioration in insulation resistance occurred due to cracking in the laminated ceramic capacitor and shorting occurred.

In reference example 2-6, there were 10 NG laminated ceramic capacitors out of 20 and the example was therefore inferior. Because in the composition ratio of the frit number D borosilicate zinc glass the proportion of ZnO was high, at 50 wt %, with respect to the 100 wt % of the glass powder, deterioration in insulation resistance occurred due to cracking in the laminated ceramic capacitor and shorting occurred. In reference example 2-8, there were 15 NG laminated ceramic capacitors out of 20 and the example was therefore inferior. Because the added amount of glass powder was small, at 2.0 wt %, deterioration in insulation resistance occurred due to cracking in the laminated ceramic capacitor and shorting occurred.

Accordingly, it can be seen that with respect to insulation resistance NG count, it is preferable that the added amount of glass powder be above 3.0 wt %. It can also be seen that it is preferable that the BaO in the borosilicate barium glass composition constitute more than 10 wt % of the glass powder. It can further be seen that it is preferable that the BaO in the borosilicate barium glass composition constitute less than 40 wt % of that glass powder.

It can still further be seen that it is preferable that the ZnO in the borosilicate zinc glass composition constitute less than 35 wt % of that glass powder.

To evaluate the Ni/Sn plating film adherence, external electrodes were formed on both ends of a laminated ceramic capacitor chip by baking at about 800° C. in a nitrogen atmosphere and Ni/Sn plating was carried out. Then, the film thickness of the Ni/Sn plating film was measured with a fluorescence X-ray film thickness meter and when the film thickness was greater than 1 μm the film was deemed to be good as indicated with a 0 in Table 2 and when it was less than 1 μm, the film was deemed inferior as indicated with a x in Table 2. In reference example 2-3, the film thickness of the Ni/Sn plating film was less than 1 μm; it could also be seen from the external appearance that the Cu electrode was exposed, and the plating adherence was therefore inferior. The reason is that the amount of glass powder was high, at 20.0 wt %, and glass separated out onto the surface of the thick film electrode and the Ni/Sn plating film adherence consequently fell.

In reference example 2-4, the film thickness of the Ni/Sn plating film was less than 1 μm; it could also be seen from the external appearance that the Cu electrode was exposed, and the plating adherence was therefore inferior. Because in the composition ratio of the frit number F borosilicate barium glass, the proportion of BaO was low, at 5 wt % with respect to the 100 wt % of the glass powder, the Ni/Sn plating film adherence was low.

In reference example 2-7, the film thickness of the Ni/Sn plating film was less than 1 μm, and it could also be seen from the external appearance that the Cu electrode was exposed, and the plating adherence was therefore inferior. Because in the composition ratio of the frit number D borosilicate zinc glass, the proportion of ZnO was low, at 2 wt % with respect to the 100 wt % of the glass powder, the Ni/Sn plating adherence was low.

In reference example 2-9, the film thickness of the Ni/Sn plating film was less than 1 μm; it could also be seen from the external appearance that the Cu electrode was exposed, and the plating adherence was therefore inferior. Because the amount of glass powder was high, at 17.0 wt %, glass separated out onto the surface of the thick film electrode and the Ni/Sn plating adherence consequently fell.

Accordingly, it can be seen that in regards to Ni/Sn plating film adherence, it is preferable that the added amount of glass powder be 15 wt % or less.

It can also be seen that it is preferable that the BaO in the composition of the borosilicate barium glass constitute more than 10 wt % of the 100 wt % of this glass.

It can further be seen that it is preferable that the ZnO in the composition of the borosilicate zinc glass constitute more than 3 wt % of this glass.

To evaluate the heat shock property, external electrodes were formed on both ends of a laminated ceramic capacitor chip by baking at about 800° C. in a nitrogen atmosphere and Ni/Sn plating was carried out. Then this laminated ceramic capacitor was dipped in a 400° C. solder tank for about two seconds and examined. When cracking occurred in the laminated ceramic capacitor it was deemed to be inferior and this was indicated by a x in Table 2. When cracking did not occur the laminated ceramic capacitor was deemed to be good and this was indicated by a 0 in Table 2. In Table 2, ΔT=375° C. means that the difference between the 400° C. solder tank temperature and 25° C. room temperature was 375°.

In reference example 2-1, cracking occurred in the laminated ceramic capacitor and it was therefore deemed to be inferior. The reason for this was that because the amount of glass powder was small, at 1.0 wt %.

In reference example 2-2, cracking occurred in the laminated ceramic capacitor and it was therefore deemed to be inferior. The reason for this cracking was that the wt % of the borosilicate zinc glass was low, at 20 wt %.

In reference example 2-4, cracking occurred in the laminated ceramic capacitor and it was therefore deemed to be inferior. Here, the composition ratio of the frit number F borosilicate barium glass has a small proportion of BaO, at 5 wt % with respect to the 100 wt % of the glass powder.

In reference example 2-5, cracking occurred in the laminated ceramic capacitor and it was therefore deemed to be inferior. In the composition ratio of the frit number J borosilicate barium glass, the proportion of BaO was large at 5 wt % with respect to the 100 wt % of the glass powder.

In reference example 2-6, cracking occurred in the laminated ceramic capacitor and it was therefore deemed to be inferior. In the composition ratio of the frit number D borosilicate barium glass, the proportion of ZnO was large at 50 wt % with respect to the 100 wt % of the glass powder.

In reference example 2-8, cracking occurred in the laminated ceramic capacitor and it was therefore deemed to be inferior. The reason for this cracking occurring was that the amount of glass powder was small, at 2.0 wt %.

Accordingly, it can be seen that with respect to heat shock property, it is preferable that the added amount of glass powder be over 3.0 wt %.

It can also be seen that it is preferable that the borosilicate zinc glass constitute more than 50 wt % of the glass powder.

It can also be seen that it is preferable that the BaO in the composition of the borosilicate barium glass constitute more than 10 wt % of that glass powder.

It can also be seen that it is preferable that the BaO in the composition of the borosilicate barium glass constitute less than 40 wt % of that glass powder.

It can also be seen that it is preferable that the ZnO in the composition of the borosilicate zinc glass constitute less than 35 wt % of that glass powder.

Accordingly, the overall evaluations show that the reference examples 2-1 to 2-9 were inferior in one or more of the insulation resistance NG count, Ni/Sn plating adherence or heat shock property characteristics and were inferior to the preferred embodiments 2-1 to 2-10.

While the overall evaluations of the reference examples 2-1 to 2-9 are x indicating that they are less preferable than the preferred embodiments 2-1 to 2-10, these reference examples are all satisfactory compared with conventional examples and can achieve the objects of the invention.

The conducting thick film composition of the present invention is not limited to the preferred embodiments described above and various changes can be made within the scope of the invention.

For example, although in this preferred embodiment the Cu powder set forth in the first preferred embodiment was used, as long as the Cu powder comprises a spherical powder and a scaly powder, the particle diameter or length need not be particularly limited. Also, only a spherical powder or only a scaly powder can be used if the particle diameter or length is adjusted. Furthermore, the particle shape need not be particularly limited. In any case, the objects of the invention can be achieved.

Also, although in this preferred embodiment an acrylic resin constituting a base resin dissolved in butyl cellosolve, which is an organic solvent, is used as the organic vehicle, a cellulose resin or a butyral resin or the like may be used as the base resin and terpineol may be used as the organic solvent.

In a conducting thick film composition according to the present invention, it is possible as a result of the Cu powder comprising a spherical powder and a scaly powder to prevent blistering of the surface of a thick film electrode and consequently it is possible to improve the strength of the bond between a ceramic element and a thick film electrode.

Also, because it is possible by this method to reduce the amount of glass powder, which had been included in large quantities in order to maintain the strength of the bond between the ceramic element and the thick film electrode, deterioration of the plating adherence caused by glass melting and covering the surface of the thick film electrode can be prevented and soldering can be improved, and therefore it is possible to improve the electrical reliability of a ceramic electronic component.

In the invention, as a result of the Cu powder comprising a borosilicate zinc glass and a borosilicate barium glass, plating liquid readily adheres and does not readily dissolve and consequently, reduction in the strength of the bond between the ceramic element and the thick film electrode caused by plating liquid permeating into the inside of the electrode can be suppressed and cracking of the ceramic element can be prevented.

Also, because by this method it is possible to reduce the amount of glass powder, which had been included in large quantities in order to maintain the strength of the bond between the ceramic element and the thick film electrode, deterioration of the plating adherence caused by glass melting and covering the surface of the thick film electrode can be prevented and soldering can be improved, and therefore it is possible to improve the electrical reliability of a ceramic electronic component.

In the invention, as a result of the Cu powder comprising a spherical powder and a scaly powder and the glass powder comprising a borosilicate zinc glass and a borosilicate barium glass, it is possible to prevent the occurrence of blistering of the surface of the thick film electrode and cracking of the ceramic element and consequently, it is possible to further improve the strength of the bond between the ceramic element and the thick film electrode.

Also, because it is possible by this method to reduce the amount of glass powder, which had been included in large quantities in order to maintain the strength of the bond between the ceramic element and the thick film electrode, deterioration of the plating adherence caused by glass melting and covering the surface of the thick film electrode can be prevented and soldering can be improved, and therefore it is possible to improve the electrical reliability of a ceramic electronic component.

In the invention, preferably, the Cu powder and the glass powder in total are contained in the amount of 65 to 85 wt % of the 100 wt % of the conducting thick film composition and the organic vehicle is contained in the amount of 15 to 35 wt % of the 100 wt % of the conducting thick film composition. By this method it is possible to increase the conducting thick film composition levelability and improve its coatability.

In the invention, preferably, the glass powder is contained in the amount of 3 to 15 wt % of the 100 wt % of the conducting thick film composition. By this method, by further increasing the strength of the bond between the ceramic element and the thick film electrode and increasing the plating adherence, it is possible to further increase the solder adherence.

In the invention, preferably, the Cu powder comprises spherical powder and scaly powder and the average particle diameter of the spherical powder is 0.3 to 5.0 µm. By this method it is possible to prevent oxidization of the conducting thick film composition and improve its moisture resistance.

In the invention, more preferably, the Cu powder comprises a spherical powder and a scaly powder and the average particle diameter of the spherical powder is 0.3 to 1.5 µm. By this method, a more optimal average particle diameter is adopted.

In the invention, preferably, the Cu powder comprises a spherical powder and a scaly powder and the spherical powder comprises a fine spherical powder of which the average particle diameter is 0.3 to 1.5 µm and a coarse spherical powder of which the average particle diameter is 2 to 5 µm. By this method, it is possible to further improve the coatability of the conducting thick film composition.

Also, in the invention, preferably, the Cu powder comprises a spherical powder and a scaly powder and the average length of the scaly powder is 10 to 40.0 µm. By this method it is possible to increase the effect of the scaly powder of retarding the sintering and shapewise also improve the coatability and make the surface smooth.

In the invention, preferably, the glass powder comprises borosilicate zinc glass and borosilicate barium glass and the borosilicate zinc glass is contained in the amount of over 50 wt % of the 100 wt % of the glass powder. By this method it is possible to improve the heat shock property of the conducting thick film composition. In the invention, preferably, the glass powder comprises a borosilicate zinc glass and a borosilicate barium glass and the borosilicate zinc glass contains 3 to 35 wt % of ZnO with respect to the 100 wt % of the borosilicate zinc glass. By this method it is possible to improve the plating adherence, insulation characteristics and heat shock property of the composition.

In the invention, preferably, the glass powder comprises a borosilicate zinc glass and a borosilicate barium glass and the borosilicate barium glass contains 10 to 40 wt % of BaO with respect to the 100 wt % of the borosilicate barium glass. By this method it is possible to improve the insulation characteristics, plating adherence and heat shock property of the composition.

Also, in the invention, preferably, the glass powder comprises a borosilicate zinc glass and a borosilicate barium glass and the borosilicate zinc glass and the borosilicate barium glass contain at least one of alumina, an alkali metal oxide and an alkaline earth metal oxide. By this method, improvement of the acid resistance of the composition by the addition of alumina and improvement of the softening of the glass powder by the addition of an alkali metal oxide or an alkaline earth metal oxide are possible.

With a thick film electrode according to the invention, it is possible to form a sintered film to constitute a thick film electrode by sintering the abovementioned conducting thick film composition and consequently, a thick film electrode for a ceramic electronic component can be manufactured easily.

With a ceramic electronic component according to the invention, it is possible to prevent blistering of a thick film electrode and cracking of the ceramic element when terminal electrodes of the ceramic electronic component are being formed and improve the strength of the bond between the ceramic element and the terminal electrodes and to improve the adherence of solder to the terminal electrodes.

With a laminated ceramic capacitor according to the invention, it is possible to prevent blistering of a thick film electrode and cracking of a stack occurring when external electrodes of the laminated ceramic capacitor are being formed and to improve the strength of the bond between the stack and the external electrodes and to improve the adherence of solder to the external electrodes.

What is claimed is:

1. A conducting thick film composition comprising powder consisting of Cu metal, glass powder and organic vehicle wherein the Cu powder comprises about 30 to about 90 wt % spherical powder and about 10 to about 70 wt % scaly-shaped powder.

2. A conducting thick film composition according to claim 1 wherein the Cu powder and the glass powder total about 65 to about 85 wt % of the 100 wt % of the conducting thick film composition and the organic vehicle is contained in the amount of about 15 to about 35 wt % of the 100 wt % of the conducting thick film composition.

3. A conducting thick film composition according to claim 1 wherein the glass powder is about 3 to about 15 wt % of the conducting thick film composition.

4. A conducting thick film composition according to claim 1 wherein the average particle diameter of the Cu spherical powder is about 0.3 to about 5.0 μm.

5. A conducting thick film composition according to claim 1 wherein the average particle diameter of the Cu spherical powder is about 0.3 to about 1.5 μm.

6. A conducting thick film composition according to claim 1 wherein the spherical powder comprises fine spherical powder of which the average particle diameter is about 0.3 to about 1.5 μm and coarse spherical powder of which the average particle diameter is about 2.0 to about 5.0 μm.

7. A conducting thick film composition according to claim 1 wherein the average length of the Cu scaly-shaped powder particles is about 10 to about 40 μm.

8. A conducting thick film composition according to claim 7 wherein the Cu powder and the glass powder total about 65 to about 85 wt % of the 100 wt % of the conducting thick film composition and the organic vehicle is contained in the amount of about 15 to about 35 wt % of the 100 wt % of the conducting thick film composition and wherein the glass powder is about 3 to about 15 wt % of the conducting thick film composition and where the average particle diameter of the Cu spherical powder is about 0.3 to about 5.0 μm.

9. A conducting thick film composition according to claim 8 wherein the spherical powder comprises fine spherical powder of which the average particle diameter is about 0.3 to about 1.5 μm and coarse spherical powder of which the average particle diameter is about 2.0 to about 5.0 μm.

10. A conducting thick film composition comprising powder consisting of Cu metal, glass powder and organic vehicle wherein the glass powder comprises more than 50 wt % borosilicate zinc glass and less than 50 wt % borosilicate barium glass.

11. A conducting thick film composition according to claim 10, wherein the Cu powder comprises spherical powder and scaly-shaped powder.

12. A conducting thick film composition according to claim 10 wherein the borosilicate zinc glass contains about 3 to about 35 wt % of ZnO with respect to the 100 wt % of the borosilicate zinc glass.

13. A conducting thick film composition according to claim 10 wherein the borosilicate barium glass contains about 10 to about 40 wt % of BaO with respect to the 100 wt % of the borosilicate barium glass.

14. A conducting thick film composition according to claim 10 wherein at least one of the borosilicate zinc glass and borosilicate barium glass contains at least one of alumina, alkali metal oxide and alkaline earth metal oxide.

15. A conducting thick film composition according to claim 11 wherein the borosilicate zinc glass is more than about 50 wt % of the total glass powder and wherein the borosilicate zinc glass contains about 3 to about 35 wt % of ZnO with respect to the 100 wt % of the borosilicate zinc glass and wherein the borosilicate barium glass contains about 10 to about 40 wt % of BaO with respect to the 100 wt % of the borosilicate barium glass.

16. A conducting thick film composition according to claim 15 wherein the Cu powder and the glass powder total about 65 to about 85 wt % of the 100 wt % of the conducting thick film composition and the organic vehicle is contained in the amount of about 15 to about 35 wt % of the 100 wt % of the conducting thick film composition and wherein the glass powder is about 3 to about 15 wt % of the conducting thick film composition and where the average particle diameter of the Cu spherical powder is about 0.3 to about 5.0 μm.

17. A thick film electrode formed on a ceramic element of a ceramic electronic component in which the thick film electrode comprises a sintered film of the conducting thick film composition according to claim 1.

18. A ceramic electronic component comprising a ceramic element and an electrode provided on the ceramic element, in which the electrode comprises a thick film electrode according to claim 17.

19. A laminated ceramic capacitor comprising a stack comprising a series of ceramic dielectric layers laminated together with pairs of internal electrodes, each pair of internal electrodes separated by a ceramic dielectric therebetween and external electrodes disposed on external ends of the stack, the external electrodes comprising thick film electrodes according to claim 17.

20. A conductive thick film composition according to claim 12, wherein the borosilicate zinc glass is about 50 to about 80 wt % of the total glass powder.

21. A conductive thick film composition according to claim 11, wherein the copper metal powder contains about 10 wt % to about 70 wt % of the scaly-shaped powder and about 30 wt % to about 90 wt % of the spherical shaped powder.

* * * * *